United States Patent [19]
Sprague et al.

[11] Patent Number: 5,796,282
[45] Date of Patent: Aug. 18, 1998

[54] LATCHING MECHANISM FOR PULSED DOMINO LOGIC WITH INHERENT RACE MARGIN AND TIME BORROWING

[75] Inventors: Milo David Sprague, Aloha; Robert J. Murray, Hillsboro, both of Oreg.

[73] Assignee: Intel Corporation, Santa Clara, Calif.

[21] Appl. No.: 700,613

[22] Filed: Aug. 12, 1996

[51] Int. Cl.$^6$ .............................................. H03K 19/017
[52] U.S. Cl. .......................... 327/210; 327/211; 327/212; 326/98
[58] Field of Search ................................. 327/199, 200, 327/211, 212, 208, 209, 210; 326/93, 97, 98, 113

[56] References Cited

U.S. PATENT DOCUMENTS

| | | | |
|---|---|---|---|
| 4,876,465 | 10/1989 | Podkowa et al. | 326/98 |
| 5,208,489 | 5/1993 | Houston | 326/98 |
| 5,402,012 | 3/1995 | Thomas | 326/97 |
| 5,453,708 | 9/1995 | Gupta et al. | 326/98 |
| 5,497,115 | 3/1996 | Millar et al. | 327/211 |
| 5,517,136 | 5/1996 | Harris et al. | 326/93 |

FOREIGN PATENT DOCUMENTS

| | | | |
|---|---|---|---|
| 63-93223 | 4/1988 | Japan | 326/98 |
| 4-96421 | 3/1992 | Japan | 326/98 |

OTHER PUBLICATIONS

"Self Resetting Logic Register & Incrementer", Authors: Ruud A. Haring, et al., IBM Research Report, RC 20322 (89846) Jan. 4, 1996, Engineering & Technology, Cover+ pp. 1–2.

*Primary Examiner*—Timothy P. Callahan
*Assistant Examiner*—T. T. Lam
*Attorney, Agent, or Firm*—Raymond Werner

[57] ABSTRACT

The present invention provides a latching mechanism for use in high-speed domino logic pipestages. The latching mechanism allows time borrowing across latch boundaries, provides sufficient hold time for the output to be sensed by the next stage, and provides a circuit configuration in which race conditions related to the latching mechanism have inherent positive margin. The latching mechanism of the present invention is applicable to fully self-resetting domino logic, globally resetting domino logic, or any combination thereof. The latching mechanism is a set dominant latch having its set input driven by the output of the last domino logic gate in a pipestage, and having its reset input driven by the output of the last domino logic gate in a pipestage ANDed with a delayed version of the pulsed clock that triggers the domino chain of the pipestage.

13 Claims, 9 Drawing Sheets

LATCHING MECHANISM FOR PULSED DOMINO LOGIC WITH INHERENT RACE MARGIN AND TIME BORROWING

BACKGROUND OF THE INVENTION

1. Field of the Invention

The present invention relates to high frequency circuit design for integrated circuits. More particularly, the present invention relates to domino CMOS logic circuits.

2. Background

Advances in semiconductor manufacturing technologies have allowed circuit designers to integrate tremendous numbers of transistors on a single die. For example, modern integrated circuits (ICs) commonly include several million transistors interconnected on a single, small substrate. Typically these are field effect transistors (FET). At the same time, computer architecture, and more particularly processor architecture, has gone in the direction of emphasizing shorter and shorter cycle times. These advances in semiconductor manufacturing and processor architecture have led designers to consider new ways of implementing basic circuit functions.

Producing IC's with shorter cycle times, means increasing the clock frequency at which these devices operate. Increasing clock frequencies means that fewer logic gate delays are permitted within each clock cycle. As described below, several styles of CMOS logic design have been developed to achieve high speed operation.

Figure 1A:
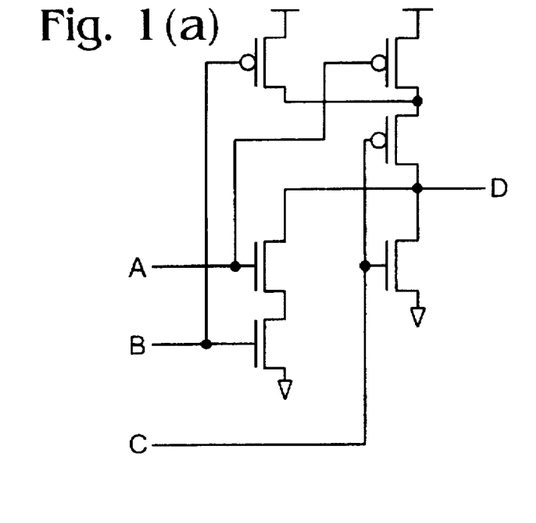
FIG. 1(a) shows the transistor level configuration of a static full CMOS complex logic gate.
Figure 1B:
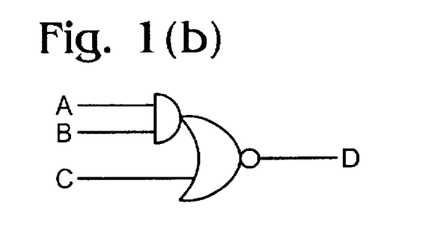
FIG. 1(b) shows a logic symbol representing the logical function implemented by the circuit of FIG. 1(a).

Static full CMOS logic requires one p-channel field effect transistor (PFET) for each n-channel field effect transistor (NFET). For complex logic gates this means either an NFET stack with a PFET OR structure, or an NFET OR structure with a PFET stack. FIG. 1(a) shows the transistor level configuration of a static full CMOS complex logic gate. FIG. 1(b) shows a logic symbol representing the logical function implemented by the circuit of FIG. 1(a). The physical layout of these complex logic gate structures produces a substantial amount junction area, and thus parasitic capacitance, associated with the output node.

Figure 2:
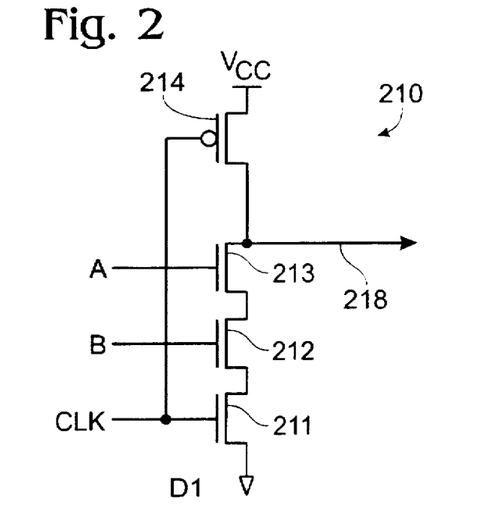
FIG. 2 shows the circuit configuration of a basic domino logic stage.
Figure 3:
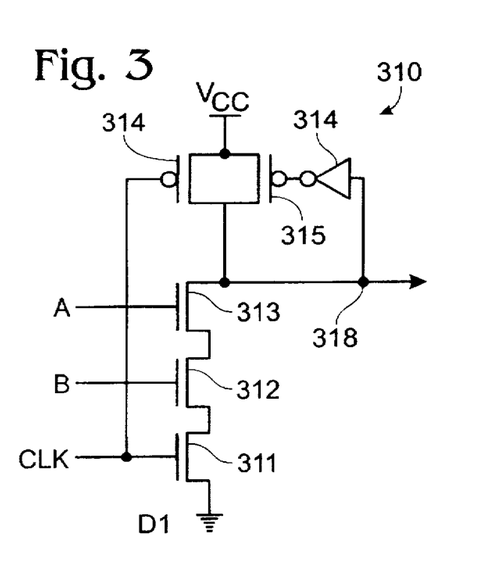
FIG. 3 shows the circuit configuration of a domino logic stage having a half keeper.
Figure 4:
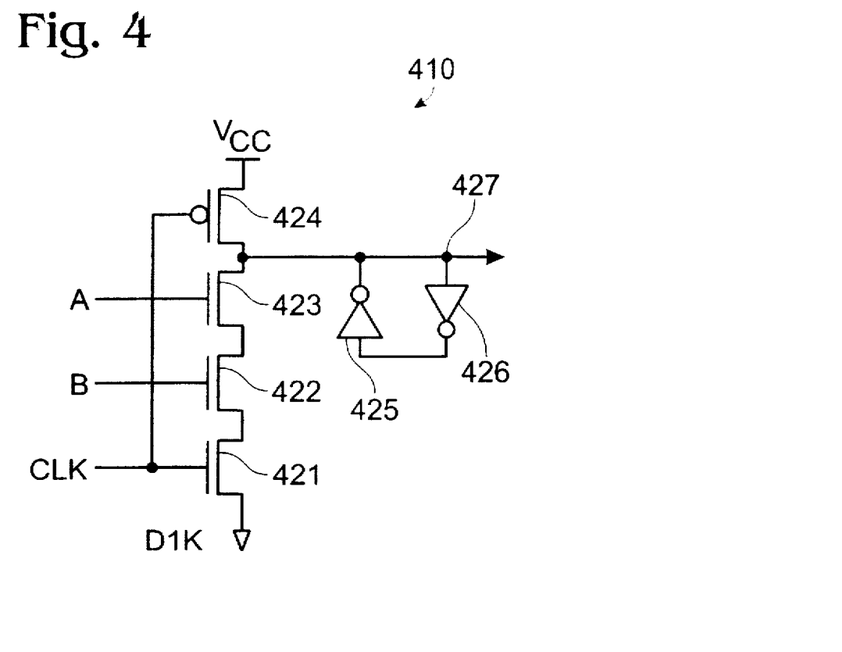
FIG. 4 shows the circuit configuration of a domino logic stage having a full keeper.
Figure 6:
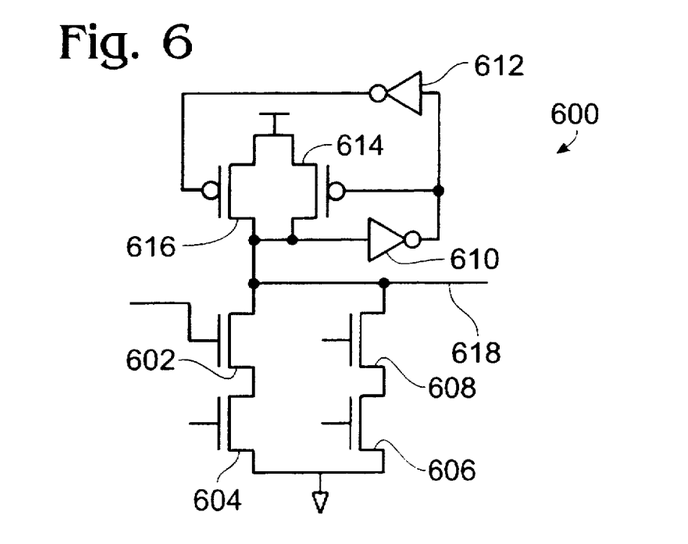
FIG. 6 shows the circuit configuration of a domino logic stage having domino compatible inputs, a half keeper, and a self-reset circuit.
Figure 7:
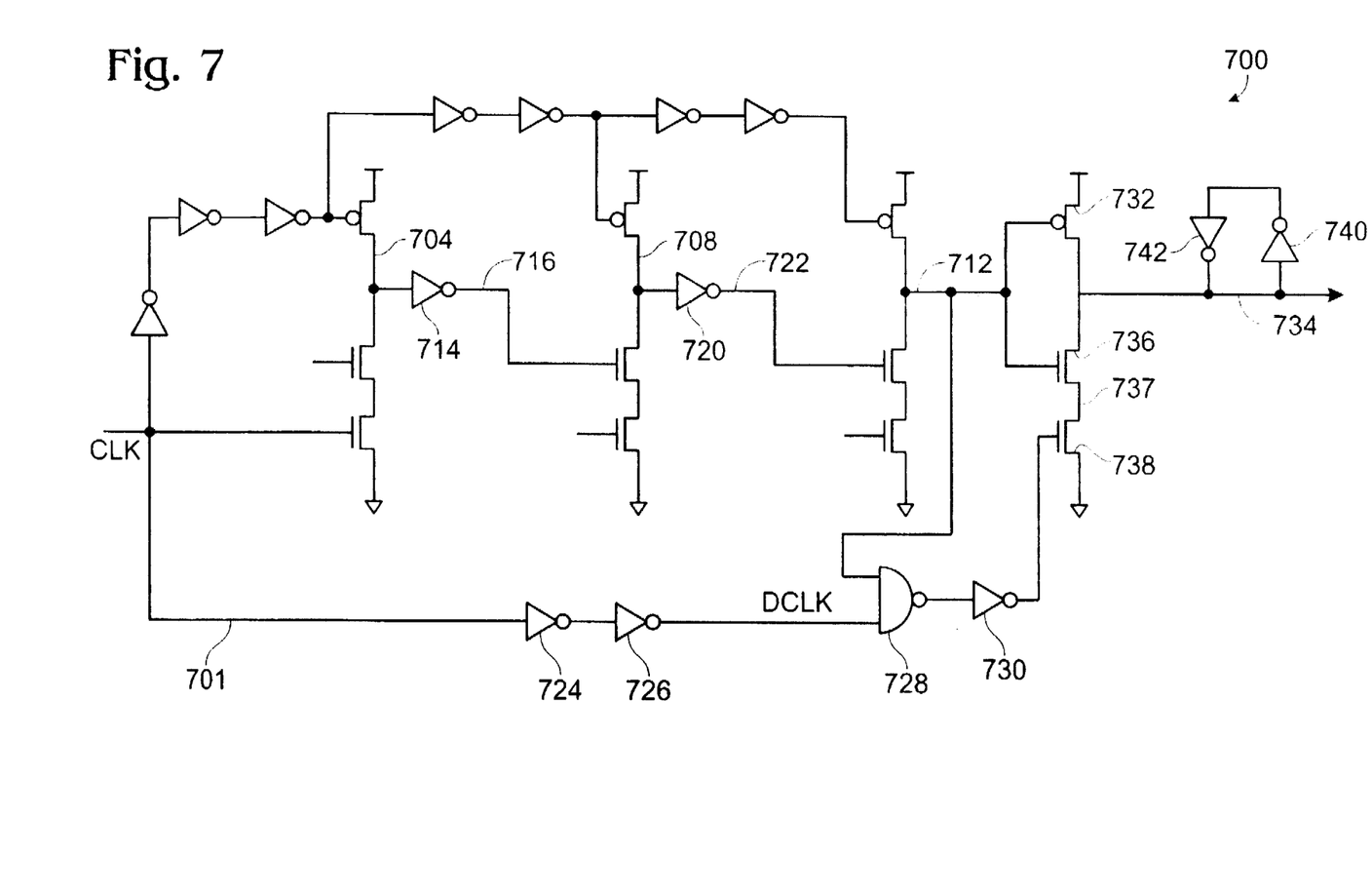
FIG. 7 shows an embodiment of the present invention in a globally reset single phase domino logic chain.

Reduced power, chip area and output capacitance can be obtained through the use of domino CMOS logic circuits. Domino CMOS logic reduces the layout and parasitic capacitance problems associated with static full CMOS complex logic gates. As will be understood by those skilled in the art, a reduction in parasitic capacitance permits higher speed and lower power operation. As compared to static circuits, domino circuits typically have a higher power density because they have more clock loading, and a higher activity factor per node. Further comparing static and domino circuits, domino logic circuits typically are more noise sensitive. FIGS. 2–4 illustrate basic domino logic stages. FIGS. 6–7 illustrate domino logic chains.

FIG. 2 shows a conventional implementation of a 2-input NAND gate 210 in domino logic. NAND gate 210 comprises NFETs 211–213 coupled in series (i.e., an n-stack) between an output node 218 and ground, and a PFET 214 coupled between a voltage supply and output node 218. The gate of PFET 214 is coupled to the gate of NFET 211 and both gates receive input clock signal CLK. Data inputs B and A are shown coupled to the gates of NFETs 212 and 213 respectively. In operation, there are two phases, a precharge phase and, evaluate phase. Alternative terms for these two phases are the precharge period and the evaluation period, respectively. In the precharge phase, output node 218 charges to a high level when CLK is low because NFET 211 is off, thus there is no conduction path to ground from output node 218 and at the same time PFET 214 is on, thus creating a conduction path from voltage supply Vcc to output node 218. For proper operation, signals A and B are expected to become stable prior to CLK going high. In the evaluate phase, CLK goes high thus turning off PFET 214 and turning on NFET 211. With NFET 211 turned on, there will be a conduction path from output node 218 to ground if both signals A and B are high. That is, if both NAND inputs are high, the output will go low during the evaluate phase, otherwise the output will remain high. Note that when output node 218 is not discharged through the n-stack during the evaluate phase, that output node 218 is "floating" high and its voltage will be subject to change due charge loss or gain though leakage currents and capacitive coupling to other signals.

FIG. 3 shows an implementation of a 2-input NAND gate 310 in domino logic including a half keeper. The half keeper overcomes the problem described above in connection with NAND gate 210 of FIG. 2, where the output node is subject to charge loss/gain while it is floating. This permits the clock frequency to be reduced and even permits the clock to be stopped while maintaining a high level at the output node of the domino logic stage. NAND gate 310 comprises NFETs 311–313 coupled in series between an output node 318 and ground, and a pair of PFETs 314–315 coupled in parallel between a voltage supply Vcc and output node 318. The gate of PFET 314 is coupled to the gate of NFET 311 and both receive input clock signal CLK. Data inputs B and A are shown coupled to the gates of NFETs 312 and 313 respectively. An inverter 317, in conjunction with PFET 315, implements the half-keeper function. Inverter 317 has its input coupled to output node 318 and its output coupled to the gate of PFET 315. In operation, when clock signal CLK rises PFET 314 turns off, but if either of inputs A or B remain low, output node 318 remains high, with PFET 315 providing the current necessary to overcome any leakage or capacitively coupled noise.

FIG. 4 shows an implementation of a 2-input NAND gate 410 in domino logic including a full keeper. Whereas the half keeper of NAND gate 310 of FIG. 3, maintains a high level at the output node of the domino logic stage, a full keeper operates to maintain, or reinforce, a high level or a low level. NAND gate 410 comprises NFETs 421–423 coupled in series between an output node 427 and ground, and a PFET 424 coupled between a voltage supply Vcc and output node 427. The gate of PFET 424 is coupled to the gate of NFET 421 and both receive input clock signal CLK. Data inputs B and A are shown coupled to the gates of NFETs 422 and 423 respectively. A cross-coupled pair of inverters 425 and 426 forms the full keeper. Inverter 426 has its output coupled to the input of inverter 425, and its input coupled to output node 427. Inverter 425 has its output coupled to output node 427.

Figure 5:
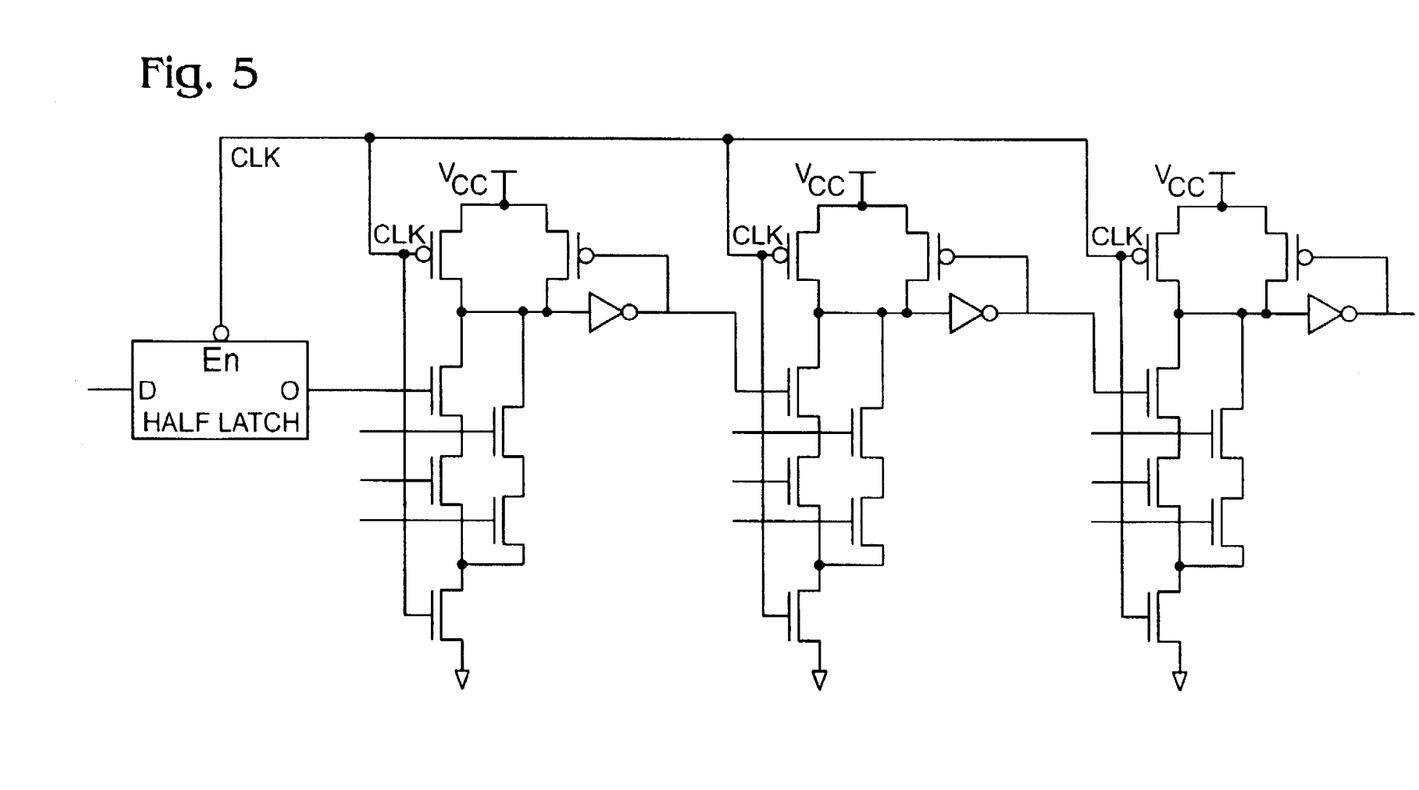
FIG. 5 shows a two phase domino logic chain.

As can be seen in FIG. 5, conventional domino circuits used with two-phase clocking, have clock ANDed NFET blocks configured to precharge in one clock phase, and to evaluate in the subsequent clock phase. An inverter typically separates the domino stages so that during precharge, the inputs to the next stage are forced low. During the evaluate phase the precharged node may transition to a low and the signal will ripple like dominos falling down through the logic. This permits the inputs to each block to come from a latch or a preceding stage of domino logic. A half keeper is typically used to hold a high level at the precharged output node of the domino logic stages.

Still referring to FIG. 5, the inputs to the domino are latched when the evaluate phase begins and open during the precharge phase. The data is setup by the end of the precharge phase before the next clock edge.

Various advanced forms of domino logic have been developed to increase the speed of operation. Single-phase pulsed domino is one form of domino logic useful for high speed operation. Single-phase pulsed domino logic can be implemented in both self-resetting and globally resetting forms. This style of logic design is susceptible to functional errors due to race conditions and therefore requires careful management of race conditions during the design process.

What is needed is a high speed CMOS domino logic circuit configuration that is tolerant of clock jitter, allows time-borrowing, and provides inherent race margin to ease the design of these circuits and to increase their operational reliability at the same time.

SUMMARY OF THE INVENTION

The present invention provides a latching mechanism for use in high-speed domino logic pipestages. The latching mechanism allows time borrowing across latch boundaries, provides sufficient hold time for the output to be sensed by the next stage, and provides a circuit configuration in which race conditions related to the latching mechanism have inherent positive margin. The latching mechanism of the present invention is applicable to fully self-resetting domino logic, globally resetting domino logic, or any combination thereof. The latching mechanism is a set dominant latch having its set input driven by the output of the last domino logic gate in a pipestage, and having its reset input driven by the output of the last domino logic gate in the pipestage ANDed with a delayed version of the pulsed clock that triggers the domino chain of the pipestage.

In an alternative embodiment of the present invention, a reset dominant latch may be used where the reset input is driven by an inverted version of the output of the last domino logic gate in a pipestage, and the set input is driven by the output of the last domino logic gate in the pipestage ORed with a delayed version of the pulsed clock that triggers the domino chain of the pipestage.

The amount of delay provided to create a delayed version of the pulsed clock, as used herein, may be equal to or greater than zero.

DETAILED DESCRIPTION OF THE INVENTION

High speed logic devices, including but not limited to microprocessors, often implement various functions with pipelined logic. Pipelined logic systems, implemented with pulsed clock domino logic, which are to be used in applications where the clock may be either stopped or run at a reduced frequency, require latching between each pipestage. The latching mechanism needs to have three characteristics. First, the latching mechanism should allow time borrowing across latch boundaries to reduce the negative effects of clock jitter. Second, the latching mechanism should provide sufficient hold time for the output to be sensed by the next stage. Third, race conditions related to the latching mechanism should have inherent positive margin in order to produce reliable, high yield circuitry. The latching mechanism of the present invention meets these requirements. Furthermore, the latching mechanism of the present invention is applicable to fully self-resetting domino logic, globally resetting domino logic, or any combination thereof.

The detailed circuit configuration of two embodiments of the present invention are described below in the section labelled "Circuit Configuration". The operation of the present invention is described below in the section labelled "Circuit Operation".

Terminology

Race condition refers to the operation of a circuit in which the result is dependent on the amount of delay, as measured from a common triggering event, such as a clock edge, experienced by signals as they propagate through the circuit.

Delay unit refers to a time period substantially equal to one inverter delay. This time period may also be referred to as a unit delay.

Keeper refers to a circuit added to a dynamic node to maintain that node at a predetermined voltage level. Typically, a keeper is added to a node that, in operation, will periodically be precharged high. The keeper supplies the charge necessary to compensate for the loss of charge due to various leakage paths, as well as loss of charge due to capacitive coupling of the node to other signal paths. A half-keeper is a circuit providing a switchable, direct, conductive pathway between the dynamic node and one voltage source, e.g., a positive voltage source, and therefore operable only to maintain the dynamic node at one level, e.g., a high level. A half-keeper circuit can be seen in FIG. 3. A full-keeper is a circuit providing a switchable, direct, conductive pathway between the dynamic node and two voltage sources, e.g., a positive voltage and ground, and therefore operable to maintain the dynamic node at either a high or low level. A full-keeper circuit can be seen in FIG. 4. A keeper-interrupt is a circuit providing a switchable, direct, conductive pathway between the dynamic node and a first voltage source, e.g., a positive voltage, and a switchable, indirect pathway between the dynamic node and a second voltage source, e.g., ground. In a keeper-interrupt circuit, there is at least one switchable circuit element coupled between the dynamic node and keeper-interrupt pathway to the second voltage source. Examples of keeper-interrupt circuits can be seen in FIGS. 9 and 10(b).

In the field of digital circuit technology generally, reset refers to bringing an output node to a logical low, or zero. However, with respect to a domino logic stage, reset refers to bringing an output node to the "non-evaluate" state. That is, a domino stage having an n-channel evaluate path will reset to a high level, but a domino stage having a p-channel evaluate path will reset to a low level.

Zipper domino refers to a circuit configuration having a plurality of domino stages connected in series, where the domino stages are alternately n-channel evaluate path stages, and p-channel evaluate path stages.

Jam latch refers to a circuit in which a pair of cross-coupled inverters has one of its two nodes electrically coupled to the output of a logic gate. The jam latch is also referred to as a full keeper.

Set dominant latch refers to a latch which is more easily set than reset. Typically a set dominant latch requires the assertion of only one signal for the latch to be set, whereas the concurrent assertion of two or more signals is needed to for the latch to be reset.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor substrate is considered, for the purpose of describing the circuit configuration of the present invention, the FET will be described using the traditional gate-drain-source, three terminal model.

Time borrowing, in the context of series connected, domino logic pipestages, refers to a process in which late arriving data is allowed to propagate through a latch boundary.

Self-resetting domino circuits are also sometimes referred to as having atomic reset circuits.

Circuit Configurations

An embodiment of the present invention includes several domino logic stages arranged in series to form a pipestage. Presented below are three embodiments of the latching mechanism of the present invention as well as both globally reset and self-resetting pipestages.

FIG. 6 illustrates a domino logic stage 600 used to form the pipestage of the present invention. As will be understood by those skilled in the art, various logic functions can be implemented by variously configuring the NFETs coupled between domino output 618 and ground. In the example illustrated in FIG. 5, two parallel, two high AND stacks are used. A first AND stack is made by coupling NFETs 602, 604 in series between domino output 618 and ground as shown in FIG. 6. A second AND stack is made by coupling NFETs 606, 608 in series between domino output 618 and ground as shown in FIG. 6. Two PFETs 614, 616, are coupled in parallel between a power supply and domino output 618. PFET 616 is part of the self-reset circuit, and provides the charge needed to return domino output 618 from a low level to a high level. Both the self-resetting function and the half keeper function of domino logic stage 600 include an inverter 610. The input of inverter 610 is coupled to domino output 618. The output of inverter 610 is coupled to the gate of PFET 614 and the input of inverter 612. Inverter 610 together with PFET 614 implement the half keeper function. The output of inverter 612 is coupled to the gate of PFET 616. Inverters 610, 612, together with PFET 616 implement the circuit that performs the self-reset function.

When domino output 618 is high, the output of inverter 610 goes low, and the low on the gate of PFET 614 turns on PFET 614 so that a conductive path between the power supply and domino output 618 exists. In this way, a high level is maintained at domino output 618 by the half-keeper.

When domino output 618 evaluates low, the output of inverter 610 goes high, consequently the output of inverter 612, and the gate of PFET 616 go low. With its gate at a low level, PFET 616 is turned on and a conductive path exists between the power supply and domino output 618. In this way, domino output 618 is reset to a high level. As domino output 618 returns to a high level, the output of inverter 610 goes low, consequently the output of inverter 612, and the gate of PFET 616 go high. With its gate at a high level, PFET 616 is turned off and no conductive path exists between the power supply and domino output 618. In this way, PFET 616 does not slow down the high to low transition of domino output 618, nor contribute to unnecessary power consumption. Typically PFETs 614, 616, are sized such that PFET 614 has a greater on-resistance than PFET 616.

Referring to the illustrative example of FIG. 7, a pipestage 700 embodying the latching mechanism of the present invention is described. Three domino logic stages using a global reset mechanism are shown is this embodiment. Those skilled in the art will recognize that the present invention is independent of the number of domino logic stages, and independent of the reset mechanism, used in the pipestage.

A pulsed clock signal 701 is coupled to one of the inputs of a first domino logic stage having an output node 704. Pulsed clock signal 701 is typically generated by an on-chip clock circuit. Such a circuit may be referred to as clock generator or clock source.

Output node 704 is coupled to static logic gate 714, whose output node 716 is coupled to a second domino logic stage having an output node 708.

Output node 708 is coupled to static logic gate 720, whose output node 722 is coupled to a third domino logic stage having an output node 712. The other inputs to domino logic stage 710 must be domino compatible.

In this illustrative embodiment of the present invention, circuit pairs are formed wherein an NFET-evaluate-stack domino stage is coupled to a static inverting logic gate. Similarly, such circuit pairs may also be formed wherein an NFET-evaluate-stack domino stage (alternatively referred to as an n-stack domino stage) is coupled to a PFET-evaluate-stack domino stage (alternatively referred to as a p-stack domino stage). Domino logic chains formed from alternating NFET-evaluate-stack domino stages and PFET-evaluate-stack domino stages, are sometimes referred to as zipper domino logic.

In this illustrative embodiment of the present invention, static logic gates 714 and 720 are shown to be inverters. Those skilled in the art will understand that static logic gates 714 and 720 may be any static, inverting, logic gates. Again, those skilled in the art will understand that the NFET-evaluate-stacks shown in FIG. 7 may be configured to implement combinatorial logic functions other than those shown in the illustrative embodiment.

A latching mechanism according to one embodiment of the present invention has a delay circuit, and a latch with input pulse extender, in which the latch has a pair of cross-coupled inverters configured as a jam latch. More particularly, a latching mechanism according to one embodiment of the present invention has a delay circuit in which an inverter 724 has its input coupled to pulsed clock signal 701, and its output coupled to an inverter 726. The output of inverter 726 is referred to as "dclk", to indicate that it is a delayed version of pulsed clock signal 701. A latch with input pulse extender according to the present invention has a PFET 732 coupled between a power supply and a latching mechanism output node 734, and two NFETs 736, 738. NFET 736 is coupled between output node 734 and intermediate node 737. NFET 738 is coupled between intermediate node 737 and ground. The gates of PFET 732 and NFET 736 are both coupled to domino output node 712. Domino output node 712, and dclk are both coupled to inputs of a two input NAND gate 728, as shown in FIG. 7. The output of NAND gate 728 is coupled to an inverter 730. The output of inverter 730 is coupled to the gate of NFET 738. An inverter 740 cross-coupled with an inverter 742 form a jam latch. One side of the jam latch is coupled to latching mechanism output node 734 as shown in FIG. 7.

NAND gate 728 together with inverter 730 implement an AND function having approximately two unit delays. Any combination of circuit elements that produces these logical and timing results may be used, not just a NAND coupled to an inverter.

Figure 8A:
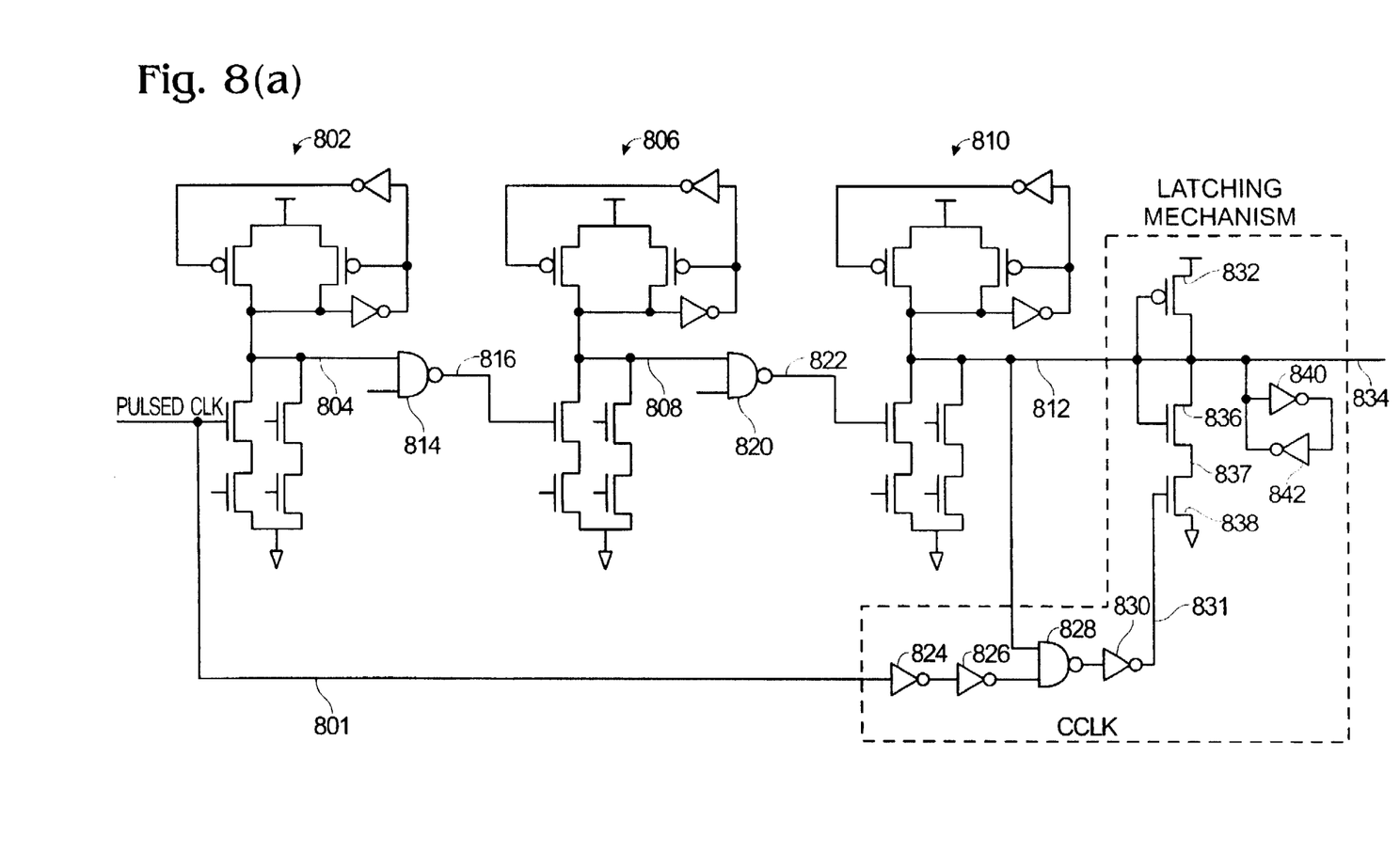
FIG. 8(a) shows an embodiment of the latching mechanism of the present invention in a self-resetting single phase domino logic chain with a jam latch.

Referring to the illustrative example of FIG. 8(a), a pipestage 800 embodying the latching mechanism of the present invention is described. Three domino logic stages are shown is this embodiment, however those skilled in the art will recognize that the present invention is independent of the number of domino logic stages used in the pipestage.

A pulsed clock signal 801 is coupled to one of the inputs of a first domino logic stage 802, having an output node 804. The other inputs to domino logic stage 802 must be domino compatible. Pulsed clock signal 801 is typically generated by an on-chip clock circuit. Such a circuit may be referred to as clock generator or clock source.

Output node 804 is coupled to one input of static logic gate 814, whose output node 816 is coupled to a second domino logic stage 806, having an output node 808.

Output node 816 is coupled to one of the inputs of a second domino logic stage 806, having an output node 808. The other inputs to domino logic stage 806 must be domino compatible.

Output node 808 is coupled to one input of static logic gate 820, whose output node 822 is coupled to a third domino logic stage 810, having an output node 812. The other inputs to domino logic stage 810 must be domino compatible.

In this illustrative embodiment of the present invention, circuit pairs are formed wherein an NFET evaluate stack domino stage is coupled to a static inverting logic gate. Similarly, such circuit pairs may also be formed wherein an NFET evaluate stack domino stage is coupled to a PFET evaluate stack domino stage. Domino logic chains formed from alternating NFET evaluate stack domino stages and PFET evaluate stack domino stages, is sometimes referred to as zipper domino logic.

In this illustrative embodiment of the present invention, static logic gates 814 and 820 are shown to be two input NAND gates. Those skilled in the art will understand that static logic gates 814 and 820 may be any static, inverting, logic gates. The circuit configurations of domino logic stages, 802, 806, and 810 are each identical to domino logic stage 600 of FIG. 6. Again, those skilled in the art will understand that the NFET evaluate stacks may be configured to implement combinatorial logic functions other than those shown in the illustrative embodiments.

A latching mechanism according to one embodiment of the present invention has a delay circuit, and a latch with input pulse extender, in which the latch has a pair of cross-coupled inverters configured as a jam latch. More particularly, a latching mechanism according to one embodiment of the present invention has a delay circuit in which an inverter 824 has its input coupled to pulsed clock signal 801, and its output coupled to an inverter 826. The output of inverter 826 is referred to as "dclk", to indicate that it is a delayed version of pulsed clock signal 801. A latch with input pulse extender according to the present invention has a PFET 832 coupled between a power supply and a latching mechanism output node 834, and two NFETs 836, 838. NFET 836 is coupled between output node 834 and intermediate node 837. NFET 838 is coupled between intermediate node 837 and ground. The gates of PFET 832 and NFET 836 are both coupled to domino output node 812. Domino output node 812 of third domino stage 810, and dclk are both coupled to inputs of a two input NAND gate 828, as shown in FIG. 8(a). The output of NAND gate 828 is coupled to an inverter 830. The output of inverter 830 is coupled to the gate of NFET 838. An inverter 840 cross-coupled with an inverter 842 form a jam latch. One side of the jam latch is coupled to latching mechanism output node 834 as shown in FIG. 8(a).

Figure 9:
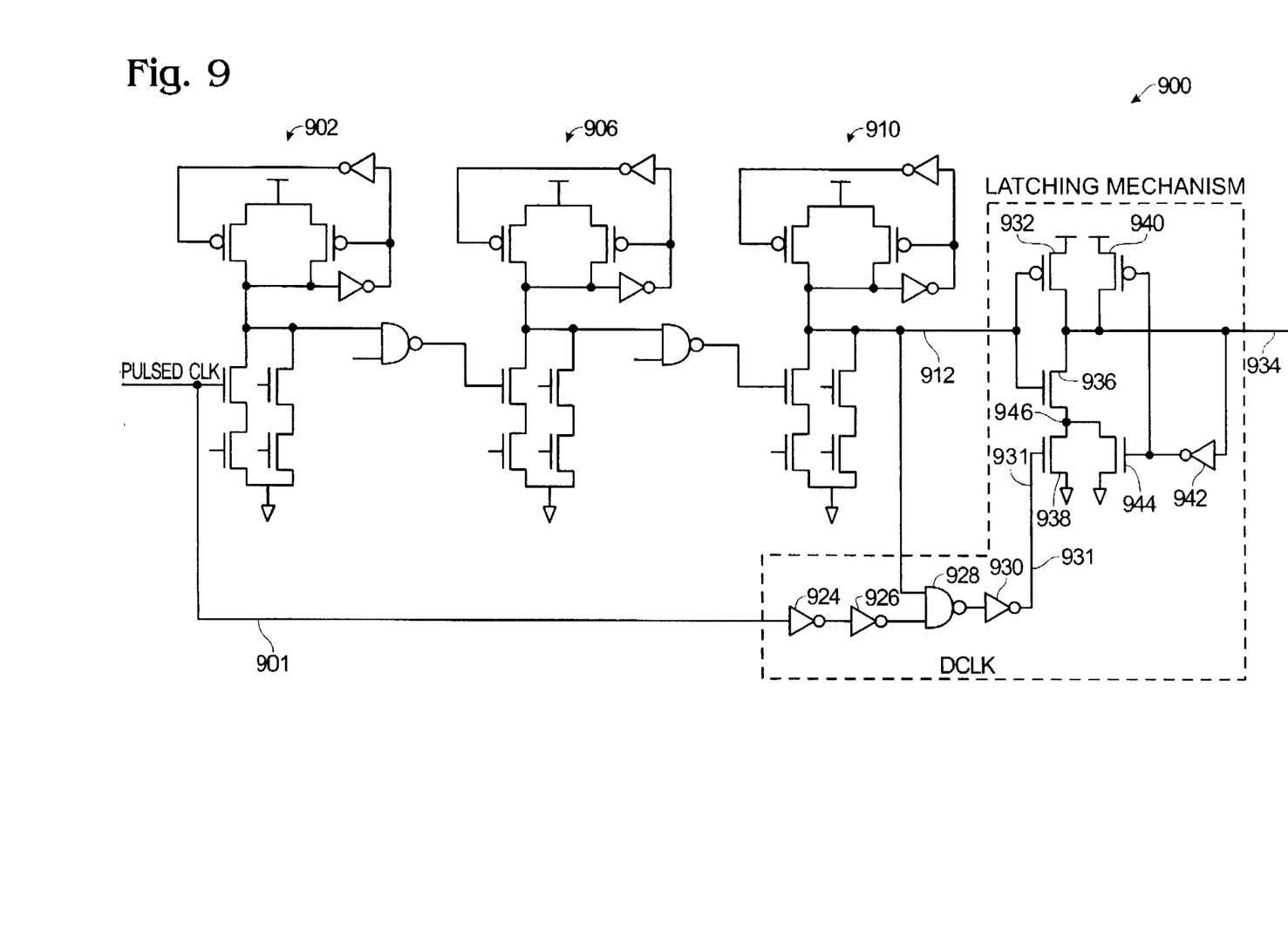
FIG. 9 shows an embodiment of the latching mechanism of the present invention in a self-resetting single phase domino logic chain with a keeper interrupt.

Referring to FIG. 9, an alternative embodiment of the present invention is shown. This embodiment is very similar to the embodiment shown in FIG. 8, and differs in the circuit configuration of the latch portion of the latching mechanism. More particularly, a latching mechanism according to this embodiment of the present invention has a delay circuit, a latch with input pulse extender, in which the latch has an inverter, a PFET and an NFET, configured as a keeper interrupt. A delay circuit has an inverter 924 having its input coupled to a pulsed clock signal 901, and its output coupled to an inverter 926. Pulsed clock signal 901 is typically generated by an on-chip clock circuit. Such a circuit may be referred to as clock generator or clock source. The output of inverter 926 is referred to as "dclk", to indicate that it is a delayed version of pulsed clock signal 901. A pulse extender according to the present invention has a PFET 932 coupled between a power supply and a latching mechanism output node 934, and three NFETs 936, 938 and 944 connected as follows. NFETs 938 and 944 are connected in parallel between an intermediate node 946 and ground, and NFET 936 is coupled in series between latching mechanism output node 934 and intermediate node 946. The gates of PFET 932 and NFET 936 are both coupled to domino output node 912. Domino output node 912 of third domino stage 910, and dclk are both coupled to inputs of a two input NAND gate 928, as shown in FIG. 9. The output of NAND gate 928 is coupled to an inverter 930. The output of inverter 930 is coupled to the gate of NFET 938. A PFET 940 is coupled between a power supply and latching mechanism output node 934. An inverter 942 has its input coupled to latching mechanism output node 934 and its output coupled to the gates of both PFET 940 and NFET 944, as shown in FIG. 9.

Figure 10A:
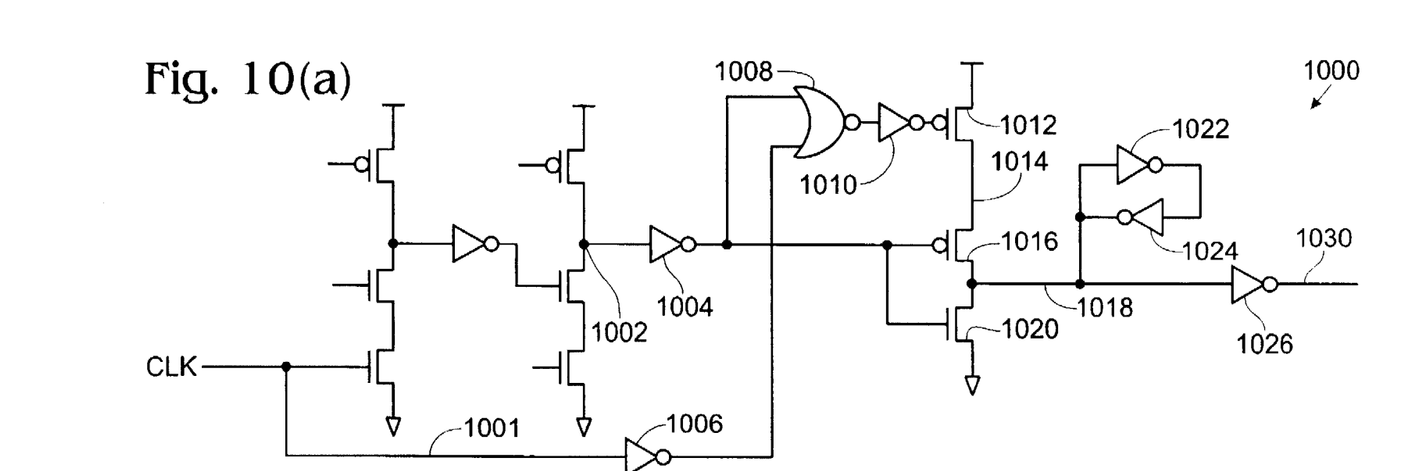
FIGS. 10(a) and 10(b) are schematic diagrams alternative designs for a reset dominant version of the latching mechanism of the present invention.

Referring to FIG. 10(a), a pipestage 1000 embodying the latching mechanism present invention configured with a reset dominant latch is shown. This illustrative embodiment uses cross-coupled inverters as is described in connection with pipestage 800 shown in FIG. 8(a).

A clock signal 1001 is coupled to an input of a first domino stage and is further coupled to the input of an inverter 1006. Inverter 1006 forms a delay circuit. An output 1002 of the last domino stage in pipestage 1000 is coupled to the input of an inverter 1004.

The reset dominant latching mechanism having an input pulse extender has a two-input NOR gate 1008. The output of NOR gate 1008 is coupled to the input of an inverter 1010. NOR gate 1008 together with inverter 1010 forms an OR logic gate. The output of inverter 1010 is coupled to the gate of a first PFET 1012. PFET 1012 is coupled between a power supply and a first intermediate node 1014. A second PFET 1016 is coupled between first intermediate node 1014 and a second intermediate node 1018. An NFET 1020 is coupled between second intermediate node 1018 and ground. The gates of both PFET 1016 and NFET 1020 are coupled to the output of inverter 1004. One side of cross-coupled inverters 1022, 1024 is coupled to second intermediate node 1018. Second intermediate node 1018 is coupled to the input of an inverter 1026 in order to generate a high active output 1030. The inclusion of inverter 1026 is not required to implement the latching mechanism of the present invention. The outputs of inverters 1004 and 1006 are coupled to the inputs of NOR gate 1008.

Figure 10B:
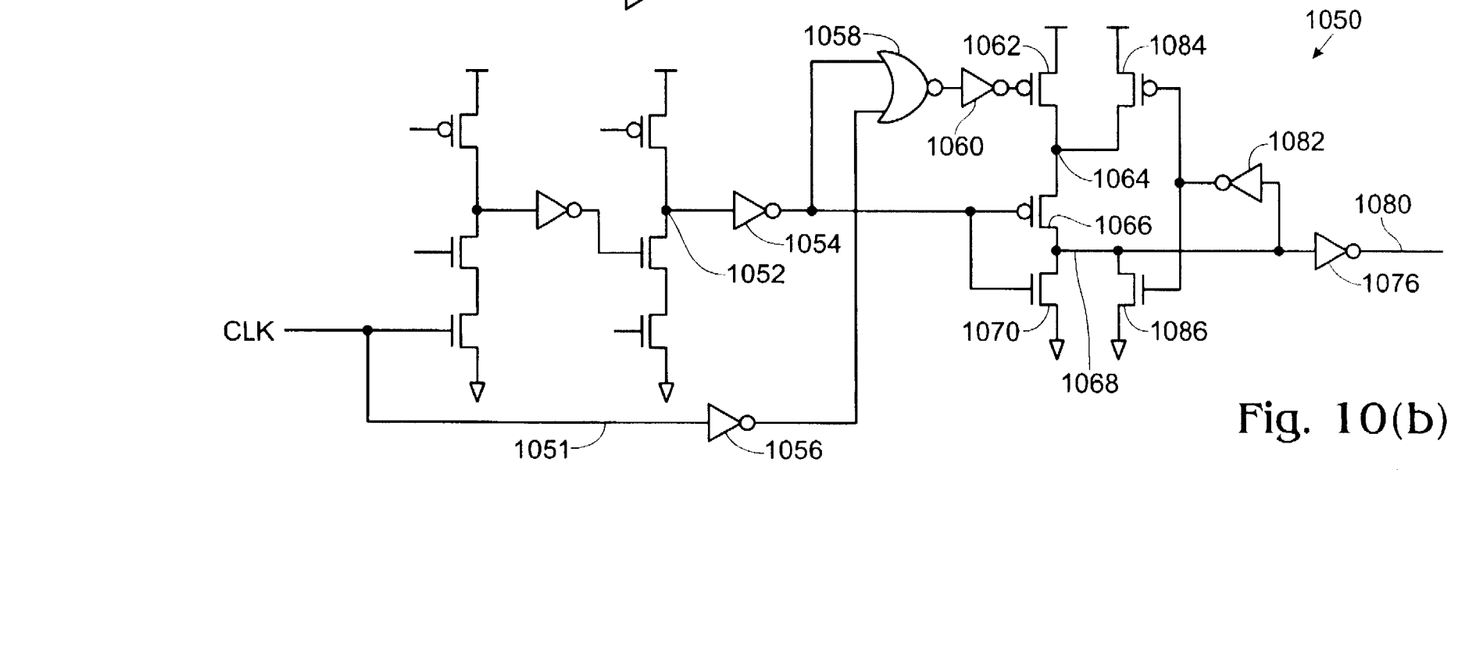

Referring to FIG. 10(b), a pipestage 1050 embodying the latching mechanism present invention configured with a reset dominant latch is shown. This illustrative embodiment uses a keeper interrupt configuration cross-coupled inverters as is described in connection with pipestage 800 shown in FIG. 8(a).

A clock signal 1001 is coupled to an input of a first domino stage and is further coupled to the input of an inverter 1006. Inverter 1006 forms a delay circuit. An output 1002 of the last domino stage in pipestage 1000 is coupled to the input of an inverter 1004.

The reset dominant latching mechanism having an input pulse extender has a two-input NOR gate 1008. The output of NOR gate 1008 is coupled to the input of an inverter 1010. NOR gate 1008 together with inverter 1010 forms an OR logic gate. The output of inverter 1010 is coupled to the gate of a first PFET 1012. PFET 1012 is coupled between a power supply and a first intermediate node 1014. A second PFET 1016 is coupled between first intermediate node 1014 and a second intermediate node 1018. An NFET 1020 is coupled between second intermediate node 1018 and ground. The gates of both PFET 1016 and NFET 1020 are coupled to the output of inverter 1004. One side of cross-coupled inverters 1022, 1024 is coupled to second intermediate node 1018. Second intermediate node 1018 is coupled to the input of an inverter 1026 in order to generate a high active output 1030. The inclusion of inverter 1026 is not required to implement the latching mechanism of the present invention. The outputs of inverters 1004 and 1006 are coupled to the inputs of NOR gate 1008.

Figure 11A:
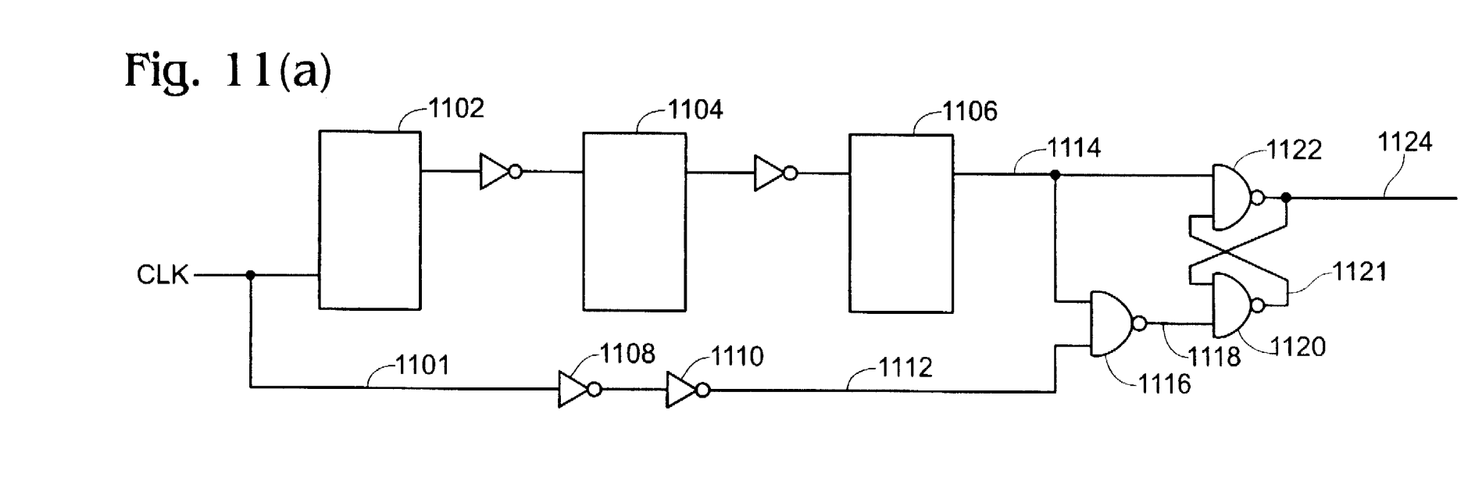
FIGS. 11(a) and 11(b) are schematic diagrams of alternative designs for input latches with pulse extending capability.

FIG. 11(a) shows a further alternative embodiment of the present invention in which the latching mechanism with input pulse extender is implemented with a pair of cross-coupled NAND gates each having at least two inputs, and a third NAND gate having at least two inputs. More particularly, FIG. 11(a) shows a pipestage having three domino logic stages 1102, 1104, 1106 which produce an output at node 1114; and a delay circuit having a first inverter 1108 and a second inverter 1110 coupled in series, with a clock signal source 1101 coupled to the input of inverter 1108. The latching mechanism with input pulse extender has a first NAND gate 1116 with at least two inputs, a second NAND 1122 with at least two inputs, and a third NAND gate 1120 with at least two inputs. Two inputs of NAND gate 1116 are coupled respectively to node 1114, and delay circuit output 1112. Two inputs of second NAND gate 1122 are coupled respectively to node 1114 and to an output 1121 of third NAND gate 1120. Two inputs of third NAND gate 1120 are coupled respectively to output 1118 of first NAND gate 1116 and to output 1124 of second NAND gate 1122.

Figure 11B:
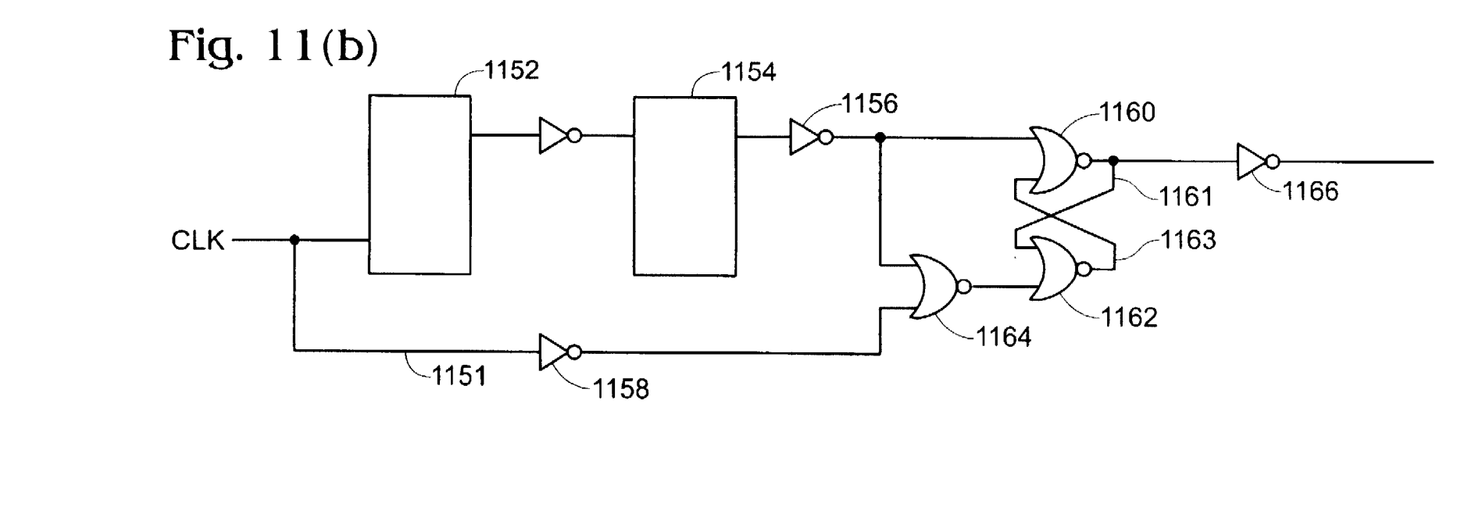

FIG. 11(b) shows a still further alternative embodiment of the present invention in which the latching mechanism with input pulse extender is implemented with a pair of cross-coupled NOR gates each having at least two inputs, and a third NOR gate having at least two inputs. More particularly, FIG. 11(b) shows a pipestage having two domino logic stages 1152, 1154, which produce an output that is coupled to an inverter 1166, and a delay circuit having an inverter 1158. A clock signal source 1151 is coupled to the input of inverter 1158. The latching mechanism with input pulse extender has a first NOR gate 1164 with at least two inputs, a second NOR gate 1160 with at least two inputs, and a third NOR gate 1162 with at least two inputs. Two inputs of NOR gate 1164 are coupled respectively to the output of inverter 1156, and to the output of inverter 1158. Two inputs of second NOR gate 1160 are coupled respectively to the output of inverter 1156 and to an output 1163 of third NOR gate 1162. Two inputs of third NOR gate 1162 are coupled respectively to the output of first NOR gate 1164 and to an output 1161 of second NOR gate 1160. The output of second NOR gate 1160 is then coupled to an inverter 1166, which produces the final output of the latching mechanism.

Circuit Operation

Figure 8B:
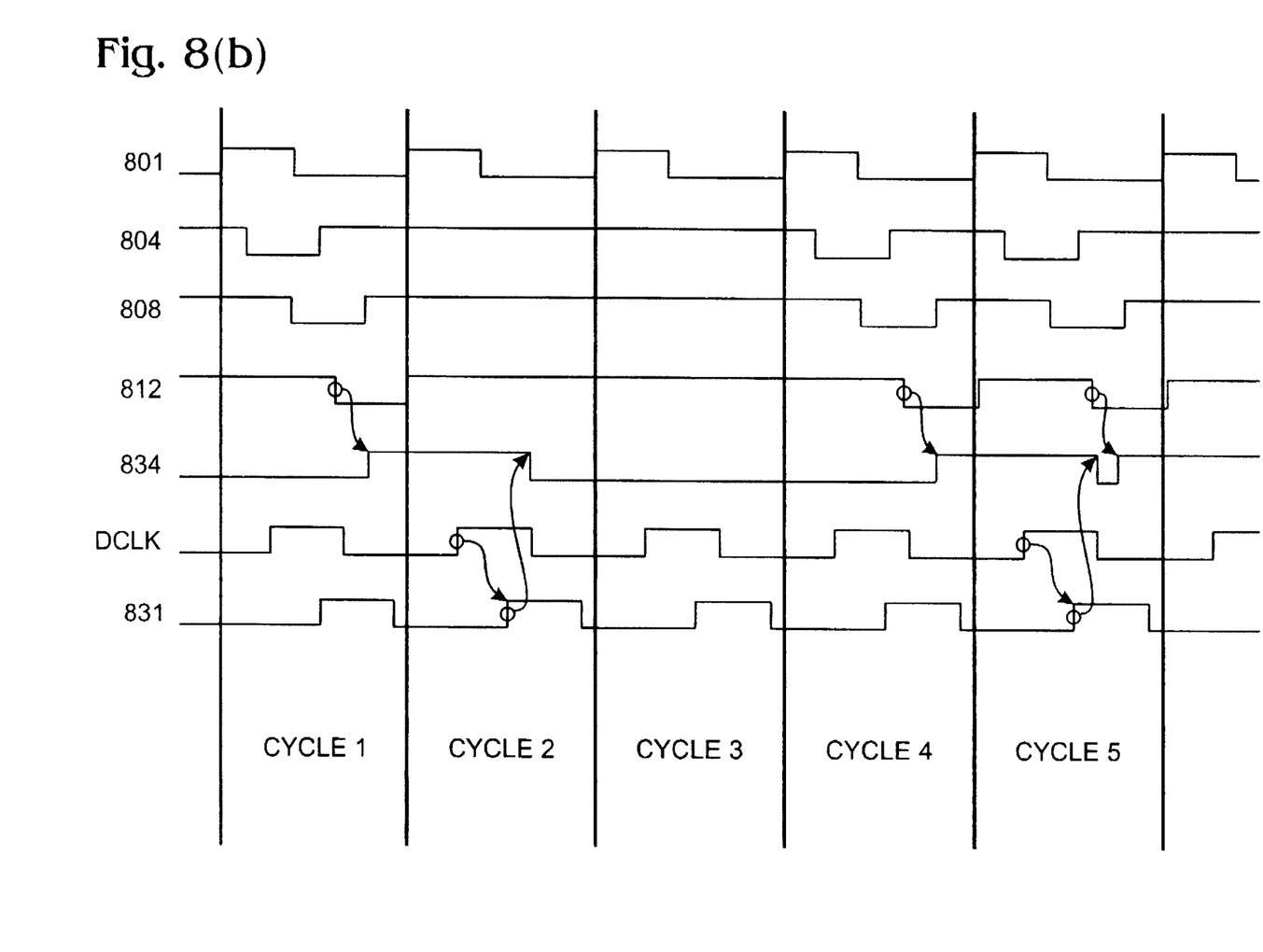
FIG. 8(b) is a timing diagram illustrating the timing relationship between various nodes in the circuit of FIG. 8(a).

The operation of an illustrative embodiment of the latching mechanism of the present invention will be understood with reference to FIGS. 8(a)–(b), and the following description. In the illustrative embodiment of the present invention described here, the pulse-width of the pulsed clock signal is approximately three inverter delays. Additionally it will be understood that the amount of delay associated with the delay circuit may be greater than or equal to zero depending on the speed of specific transistors chosen by the designer, and that the timing constraints which are satisfied by the present invention are: (1) providing the required hold-time at the output of the latching mechanism for the following pipestage to receive that data; (2) providing the required set-up time at the output of the latching mechanism for the following pipestage to receive that data; and (3) providing positive margin to the race between the delayed clock signal going low and the last domino stage output being reset to a high level to prevent false resets of the latching mechanism.

As shown in CYCLE 1 of FIG. 8(b), when the inputs to the first two of the domino stages in pipestage 800 are such that they will evaluate low, then node 812, of the third domino stage will evaluate low, and output 834 of the latching mechanism will be driven high. Before node 812 can be reset, the latch is disabled by the fall of the delayed clock node, dclk, and the output value is maintained until the next clock cycle.

In a non-evaluate cycle, such as CYCLE 2 and CYCLE 3 of FIG. 8(b), node 812 stays high and a delayed clock pulse arrives at node 831, and causes output 834 to be driven low and then maintained. Since the pull-up path of the latch is ungated, a late evaluate pulse can propagate and time borrowing is enabled. The structure also provides a hold time of five delay units. There are two race conditions associated with the latching mechanism, a local race and a global race.

The local race starts at the fall of node 812 and is between the subsequent fall of node 831, two inversion later, and the rise of node 812. The width of the output pulse at node 812 pulse is three delay units, so this local race has one unit of positive margin. If the pulse width of the output at node 812 was shorter than delay path through NAND 828 and inverter 830 then output 834 of the latching mechanism would begin to be reset low before the following pipestage has recognized that output 834 went high.

The global race, starts at the rise of pulsed clock signal 801 and, assuming the local race is met, is between the fall of dclk and the rise of node 812. As measured from the rise of pulsed clock signal 801, the fall of dclk and the rise of node 812, occur five delay units and eight delay units later respectively. In other words, the global race has three delay units of positive margin, by design, thus providing sufficient race margin to create a robust circuit configuration which is easier to design with.

An alternative embodiment of the present invention is shown in FIG. 9. The operation of the FIG. 9 embodiment, with respect to timing and race margins, is the same as that of the embodiment shown in FIG. 8(a). In operation, given a fixed power budget, latch output 934 can be driven high more quickly than latch output 834. The reasons for this are as follows. First, latch output 834 must overcome the output of inverter 842 which tries to maintain the output at a low level. Secondly, an additional advantage of the circuit configuration used for latch output 934 is that less parasitic capacitance is present and therefore less charge is required to drive the output high.

Conclusion

The present invention provides latching mechanism for use in high-speed domino logic pipestages. The latching mechanism allows time borrowing across latch boundaries by incorporating a set dominant latch structure, provides five delay units of hold time to ensure that the output will be sensed by the next stage, and provides a circuit configuration in which race conditions related to the latching mechanism have inherent positive margin.

An advantage of the present invention is that the difficulty of circuit design is reduced because the inherent margins of the circuits of the present invention do not require as great a degree of precision in simulation.

A further advantage of the present invention is that sensitivity to clock jitter is reduced by permitting time borrowing across latch boundaries.

It will be understood that various changes in the details, materials, and arrangements of the parts and steps which have been described and illustrated in order to explain the nature of this invention may be made by those skilled in the art without departing from the principles and scope of the invention as expressed in the subjoined claims.

What is claimed is:

1. A circuit comprising:
   a clock source;
   a domino logic chain having an input and an output, the domino logic chain input being coupled to the clock source;
   a delay circuit having an input and an output, the delay circuit input being coupled to the clock source; and
   a latch with input pulse extender, comprising
   an AND logic gate having at least a first input coupled to the delay circuit output, a second input coupled to the domino chain output, and an output;
   a first PFET coupled between a power supply and the latch output;
   a first NFET coupled between the latch output and an intermediate node; and
   a second NFET coupled between the intermediate node and ground;
   wherein the gates of the first PFET and first NFET are each coupled to the domino logic chain output, and the gate of the second NFET is coupled to the output of the AND logic gate.

2. The circuit of claim 1, wherein the latch with input pulse extender further comprises:
   a second PFET coupled between the power supply and the latch output;
   a third NFET coupled between the intermediate node and ground; and
   an inverter having an input coupled to the latch output and an output coupled to the gate of the second PFET and further coupled the gate of the third NFET.

3. The circuit of claim 1 wherein the latch with input pulse extender further comprises:
   a first inverter having an input and an output, the first inverter input being coupled to the latch output; and
   a second inverter having an input coupled to the first inverter output, and an output coupled to the latch output.

4. The circuit of claim 2, wherein the two-input AND logic gate comprises a NAND gate having two inputs and an output, and an inverter having an input coupled to the output of the two-input NAND gate.

5. The circuit of claim 3, wherein the two-input AND logic gate comprises a NAND gate having two inputs and an output, and an inverter having an input coupled to the output of the two-input NAND gate.

6. The circuit of claim 1, wherein the latch with input pulse extender is a set dominant latch.

7. The circuit of claim 1, wherein the latch with input pulse extender is a reset dominant latch.

8. The circuit of claim 1, wherein the delay circuit comprises at least one inverting logic gate.

9. A circuit comprising:
   a clock source;
   a domino logic chain having an input and an output, the domino logic chain input being coupled to the clock source;
   a delay circuit having an input and an output, the delay circuit input being coupled to the clock source; and
   a latch with input pulse extender, comprising
   an OR logic gate having at least a first input coupled the domino logic chain, a second input coupled to the delay circuit, and an output;
   a first PFET coupled between a power supply and a first intermediate node;
   a second PFET coupled between the first intermediate node and a second intermediate node; and
   an NFET coupled between the second intermediate node and ground;
   wherein the gate of the second PFET and the gate of the NFET are both coupled to the domino logic chain, and the gate of the first PFET is coupled to the output of the OR logic gate.

10. The circuit of claim 9, wherein the latch with input pulse extender further comprises:
    a first inverter having an input and an output, the first inverter input being coupled to the second intermediate node; and a second inverter having an input coupled to the first inverter output, and an output coupled to the second intermediate node.

11. The circuit of claim 9, wherein the OR logic gate comprises:

a NOR gate having an output coupled to the input of an inverter.

12. A circuit comprising:

a clock source;

a domino logic chain having an input and an output, the domino logic chain input being coupled to the clock source;

a delay circuit having an input and an output, the delay circuit input being coupled to the clock source; and a latch with input pulse extender, comprising a first NAND gate, a second NAND gate, and a third NAND gate, each having at least two inputs and an output;

wherein the first NAND gate has two inputs coupled respectively to the output of the delay circuit and the output of the domino logic chain, the second NAND gate has two inputs coupled respectively to the output of the domino logic chain and the output of the third NAND gate, and the third NAND gate has two inputs coupled respectively to output of the first NAND gate and the output of the second NAND gate.

13. A circuit comprising:

a clock source;

a domino logic chain having an input and an output, the domino logic chain input being coupled to the clock source;

a delay circuit having an input and an output, the delay circuit input being coupled to the clock source; and a latch with input pulse extender, comprising a first NOR gate, a second NOR gate, and a third NOR gate, each having at least two inputs and an output;

wherein the first NOR gate has two inputs coupled respectively to the output of the delay circuit and an inverted version of the output of the domino logic chain, the second NOR gate has two inputs coupled respectively to the inverted version of the output of the domino logic chain and the output of the third NOR gate, and the third NOR gate has two inputs coupled respectively to output of the first NOR gate and the output of the second NOR gate.

* * * * *